United States Patent
Pienimaa

[11] Patent Number: 6,073,829
[45] Date of Patent: Jun. 13, 2000

[54] METHOD AND ARRANGEMENT FOR ATTACHING A COMPONENT

[75] Inventor: Seppo Pienimaa, Salo, Finland

[73] Assignee: Nokia Mobile Phones Limited, Espoo, Finland

[21] Appl. No.: 09/031,249

[22] Filed: Feb. 26, 1998

[30] Foreign Application Priority Data

Feb. 27, 1997 [FI] Finland ................................. 970822

[51] Int. Cl.$^7$ ................................................ H05K 3/34
[52] U.S. Cl. ............................... 228/180.22; 228/180.22; 228/180.1; 228/180.21; 228/245; 228/56.3; 228/123.1; 228/254; 228/209; 228/211
[58] Field of Search ................... 228/180.22, 180.1, 228/180.21, 245, 56.3, 123.1, 254, 209, 211

[56] References Cited

U.S. PATENT DOCUMENTS

| | | | |
|---|---|---|---|
| 5,320,272 | 6/1994 | Melton et al. | 228/180.21 |
| 5,431,328 | 7/1995 | Chang et al. | 228/180.22 |
| 5,508,228 | 4/1996 | Nolan et al. | 437/183 |
| 5,551,627 | 9/1996 | Leicht et al. | 228/180.22 |
| 5,773,359 | 6/1998 | Mitchell et al. | 438/614 |

FOREIGN PATENT DOCUMENTS

| | | |
|---|---|---|
| 42 23 280 A1 | 1/1993 | Germany. |
| 08102464 | 4/1996 | Japan. |
| 08213400 | 8/1996 | Japan. |
| WO 96/13353 | 5/1996 | WIPO. |

OTHER PUBLICATIONS

"Characteristics and Potential Application of Polyimide–Core–Bump to Flip Chip", Nishimori et al., Proceedings of Electronic Components & Technology Conference (ECTC) 1995, pp. 515–519.

*Primary Examiner*—Patrick Ryan
*Assistant Examiner*—M. Alexandra Elve
*Attorney, Agent, or Firm*—Perman & Green, LLP

[57] ABSTRACT

The invention is related to a method of fabricating an attachment bump of a component (11). In accordance with the invention, a flexible preform (13*a*) is fabricated, which is plated with materials (13*b*) appropriate for metallurgical bonding. The invention is also related to a method of attaching a component (11) to the surface of a circuit card (15) using bumps. In accordance with the invention, bumps are formed from preforms (13*a*) made from a flexible material, which preforms (13*a*) are metallized (13*b*) over their entire surface. The bump (13*a*, 13*b*) is attached to the attachment pads (12*a*, 16*a*) of the component (11) and the circuit card (15) by means of metallizations (12*b*, 13*b*, 16*b*) between the attachment pads and the bump. The bond is formed metallurgically by transfusion. The surface of the bonding side of the component (11) is coated with an insulating material (14) before the mentioned bonding elsewhere than at the attachment pads (12). The mentioned insulating material (14) is thermoplastic, thermoplastic resin or thermosetting plastic in the B state. To accomplish metallurgical bonding of the bonding material, bismuth (Bi) is used as part of the material.

12 Claims, 3 Drawing Sheets

PRIOR ART

CROSS SECTION A-A

METHOD AND ARRANGEMENT FOR ATTACHING A COMPONENT

BACKGROUND OF THE INVENTION

1. Field of the Invention

The invention relates to a method of attaching a component. The invention is preferably applied for attaching an integrated circuit (IC) or other component electrically by the Direct Chip Attachment (DCA) method to a circuit card, interposer or other substrate and for protecting the area remaining between the component and the substrate.

2. Description of the Related Art

A known technique is the attachment of semiconductor components to a circuit card underneath the component by means of column-like conducting parts that are formed on the pads. These parts are generally fabricated from a metal such as tin and the parts are called bumps. The component is mounted resting on these bumps. A known method is so-called Flip Chip Technology (FCT), according to which non-encapsulated semiconductor components are attached to the substrate with metal bumps by soldering or by melting the bumps. The bumps are formed by the following process stages: vacuum deposition of the pads, i.e. the attachment pads, using another metal such as tin or lead in combination with a subsequent soldering process. The bump can also be made of gold. With this technique, the bump pitch can be reduced to a minimum of about 200 µm. The bump pitch is here taken to mean the distance between the centre points of adjacent bumps. Following the attachment, the free space remaining between the component and the circuit card is filled with an insulation using a special filling process in order to protect the bonding side of the component.

The problem with this technology is that the metal bumps and joints break easily, e.g. due to temperature variations. The shear stresses of the joint are also reduced by a mounting process in which the component is raised when the bumps have melted. In order to reduce the forces to which the joint is subjected and to protect, the space between the attached component and the substrate has to be filled with an insulating material. For this reason, space must be reserved around the component for properly apportioning the insulating material, that is, filling the space between the component and the substrate with a correct amount of the insulating material. The substrate must be heated so that the insulating material spreads out under the component. Mastery of the spreading of the insulating material and the simultaneous curing is a demanding process and, furthermore, the central area that is comprised of components attached using several concentric rows of bumps often remains unfilled. A further problem is that testing of the loose microcircuits causes holes in the bumps, thereby impairing the attachment. For FCT bumps, the integrated circuit must from the outset be especially designed or a special metal surface must be applied to its surface in order to make the bumps.

Also previously known from the article Characteristics and Potential Application of Polyimide-Core-Bump to Flip Chip, Takashi Nishimori et al., *Proceedings of Electronic Components & Technology Conference (ECTC)* 1995, pages 515–519, is a column-shaped bump having an elastic core. The completed bump with its surrounding area is shown in a cross-sectional view in FIG. 1. The bump 3 is made using a multistage method in which the mentioned core 3*a* is formed from photosensitive polyimide on top of the attachment pad 2 of component 1. An even layer of polyimide is spread with a spinner on the surface of the component at a speed of about 2000–5000 1/s rotations per second. Photosensitive polyimide is exposed to ultraviolet light at the middle of the attachment pad 2 at the point of the bump 3 which protrudes through the mask, so that the photosensitive polyimide remains on the attachment pad during the stage of removing the excess material, and the excess polyimide is also removed. The core 3*a* of the bump and the surrounding free area of the attachment pad 2 are metallized with a homogeneous layer 3*b* when the core 3*a* is formed in the above-mentioned manner on the attachment pad 2. The metal surface 3*b* is spread by the sputtering method in which a coating is formed on the surface of the component 1. Removal of the excess metal coating can be carried out with several alternative methods including etching, etching after plating or a liftoff process. The bump is bonded to the circuit card with solder or anisotropic glue. During bonding of the component, oxidized spots on the metal surface are removed most preferably with flux in the soldering process. The metallized bump is bonded both electrically and mechanically to the attachment pad, which is covered with circuit card solder in such a way that the fused solder rises up along the edges of the bump that has been pressed into the circuit card's attachment pad from the attachment pad of the circuit card towards the attachment pad of the component, surrounding the bump with solder. The dimensions of the bump are preferably 30 µm high and 30 µm wide. The bump pitch is 90 µm at its smallest.

Previously known technique is also presented in the following patent applications: JP-A 8-213 400, Solder Bump, Formation of Solder Bump, and Solder Bump Forming Body, Toshiba Corp., 8.2.1995 and DE-A1-42 23 280, Schaltkreisträger-Baueinheit und Verfahren zu deren Herstellung, Sharp K.K., 15.7.1992.

The problem with this method is the weak or non-existent formation of a metal layer 3*b* on the vertical surface of core 3*a* of the bump in the sputtering stage. During bonding the solder spreads along the metal surface 3*b* and does not adhere to the bump at the place where there is not a sufficient metal layer 3*b*. A further problem is the brittleness and stresses of the intermediate metals formed between the core 3*a* and the metal layer 3*b*, since the brittleness and stresses can cause the metal layer 3*b* to work loose from the surface of the core 3*a* of the bump. Furthermore, there is a problem in that sufficient space must be arranged around the core 3*a* to provide contact of the metal surface 3*b* with the attachment pad 2. A further problem is that the metal layer 3*b* on the straight vertical surface is not flexible, which means that the thin metal layer 3*b* cracks easily when the stress caused by the flexing of the bump 3 is directed at the junctures of the horizontal and vertical surfaces of the metal layer 3*b*. The problem in methods where the excess metal layer is removed is that when a photoresist such as photosensitive polyimide is spread on them with a spinner after formation of the core 3*a* of the bump, there are formed behind the core 3*a* of the bump, in the direction of spreading of the photoresist, spots where only a little photoresist is applied or none at all. This leads to flaws in the pattern on the metal surface during the etching stage. Another problem is that the metal layer 3*b* of the bump becomes oxidized, which is due to the properties of the metal required in the method. Oxidization hampers electrical testing of the component 1 because a proper electrical connection cannot be made to the bumps 3 during testing.

BRIEF SUMMARY OF THE INVENTION

The purpose of the invention is to resolve the above-described problems of the prior art.

The method in accordance with the invention is characterized by the features in the characterizing parts of claims 1 and 2. The attachment bump in accordance with the invention is characterized by the features that are presented in the characterizing part of claim 7. The arrangement in accordance with the invention is characterized by the features that are presented in the characterizing part of claim 8. Preferred embodiments of the invention are presented in the characterizing parts of the dependent claims.

The invention relates to a method of fabricating the attachment bump of a component and to a method of attaching the component to the surface of a circuit card by means of bumps. A circuit card is here taken to mean any substrate having attachment pads for the electrical interconnection of a component to it. In accordance with the invention, the bumps are formed from preforms made of a flexible material. The preforms are preferably fabricated from a compound polymer which is mainly comprised of divinylbenzine. In accordance with the invention, the preforms are metallized over their entire surface and the bump thus formed is bonded to the attachment pad of the component and the attachment pad of the substrate by the metal surfaces between them and the bump. The bump is preferably 50 μm in diameter. The bump pitch can be even less than 100 μm.

In one application of the method the joint is formed metallurgically by transfusion. The advantage of the invention is that in making the attachment, fused tin (Sn) or gas or any other separate additional material are not needed. The component is attached by pressing the metallurgical joint, at the formation temperature of about 160–180° C., solidly on to the circuit card without separate solderings.

In one application of the met hod, the free surface of the bonding side of the component is coated, on the area outside the attachment pads, with an insulating material before the component is attached to the circuit card. The advantage of the invention in this case is that the component takes up only its own amount of space on the circuit card because no space need be reserved for filling the empty space on the pad side after the joint is made. This is particularly important in devices in which the objective is to pack a large number of components into a small space, such as in mobile phones. Protection of the bonding side of the component is provided by plating it with an insulating material before attachment to the circuit card.

In one application of the method, the insulating material mentioned is thermoplastic, thermoplastic resin or thermosetting plastic in the B state, and it is cured after attachment of the component.

The invention also relates to the attachment bump of a component. In accordance with the invention, this comprises
a flexible preform and
a metal layer suitable for metallurgical bonding on the outer surface of the preform.

The invention is also related to an arrangement for attaching a component to a circuit card. In accordance with the invention this comprises
a first lead surface on the attachment pad of the component,
a second lead surface on the attachment pad of the circuit card,
metal layers on the attachment pads mentioned,
a flexible preform between the component and the circuit card and
a metal layer on the outer surface of the preform to effect electrical bonding of the metal surfaces of the lead surfaces of the component and the circuit card with each other.

In one application of the joint, the mentioned metal surface and metal surfaces comprise the material required for the metallurgical bonding.

The material that is preferably used as part of the bonding material for the method, attachment bump and arrangement in order to effect metallurgical bonding is bismuth (Bi), and alternatively an alloy of bismuth (Bi) and tin (Sn). The bump is metallized with a bonding metal, preferably with chrome (Cr), nickel (Ni) or copper (Cu), and layers of bismuth (Bi) and tin (Sn). In this case, in the metal surface superimposed on the fixing metallization is preferably an undercoat of a layer of tin 10–50 μm in thickness and preferably an overcoat of 1 μm of bismuth (Bi). Accordingly, the advantage of the invention is that the component can be tested in isolation because the bumps metallized with the semiprecious metal bismuth (Bi) do not oxidize. The testing can thus be carried out reliably and simply.

In one application of the method the attachment bump and the joint, the preform is spherical.

A further advantage of the invention is that changes due to the method of joining according to the invention need not be made to the silicon wafer process used in fabricating the integrated circuit.

Another advantage of the invention is that the method according to the invention can be used for attaching a variety of components, preferably densely packed components that are fabricated at the silicon wafer level, such as bare semiconductors, i.e. Integrated Circuits (IC), and the invention can also be used for attaching passive components that are fabricated at the silicon wafer level, in which one or more passive elements such as resistors, coils, capacitors but also other components of a similar type are attached. The substrate is preferably a circuit the attachment bump, including a plastic, ceramic, glass, metal or silicon-based circuit card.

BRIEF DESCRIPTION OF THE DRAWINGS

The invention is described in the accompanying drawings in which

FIG. 1 has been discussed in the description of the prior art above.

FIG. 2 shows a component that is to be attached in the manner according to the invention as seen from the bonding side. The attachment pads, which are not visible in the figure, but which are under the metallized preforms, i.e. under the bumps, and the bumps are arranged around the periphery of the component. Electrical connections run from the attachment pads to the middle part of the component, where the functional components of the circuit reside. Round holes for attachment pads are shown in the insulation layer 14. Visible in the holes are spherical bumps 13 for the electrical bonding of the component to the circuit card or similar connection surface.

FIG. 3 shows a component 11 that is to be attached in the manner according to the invention viewed in plane A—A of FIG. 2. The component 11 per se is seen in the upper part of this figure and the elements intended for attachment, which are shown in FIG. 2, are seen below it. Resting on the attachment pads 12 are attachment bumps 13, which are surrounded by an insulating layer 14, which is affixed to the surface of the bonding side of the component 11.

Described in the following is the joining of a bump to the component's pad and the circuit card's pad using the metallurgical bonding method which is known from patent application PCT/FI 95/00599. In the metallurgical bonding method, the metals are bonded together by so-called transfusion at a temperature lower than their melting temperature and they cannot be separated from each other until they are at the melting temperature. Bismuth (Bi) is bonded to tin (Sn) or to an alloy of tin (Sn) and bismuth (Bi) at a temperature of about 150–160° C. Debonding nevertheless occurs at a higher temperature, about 230–240° C. The melting temperature of bismuth (Bi) is 271° C. The melting temperature of tin (Sn) is 232° C. The alloy should preferably contain less than 10% of bismuth (Bi) in order for the metallurgical transfusion process to take place as expected.

Figure 4:
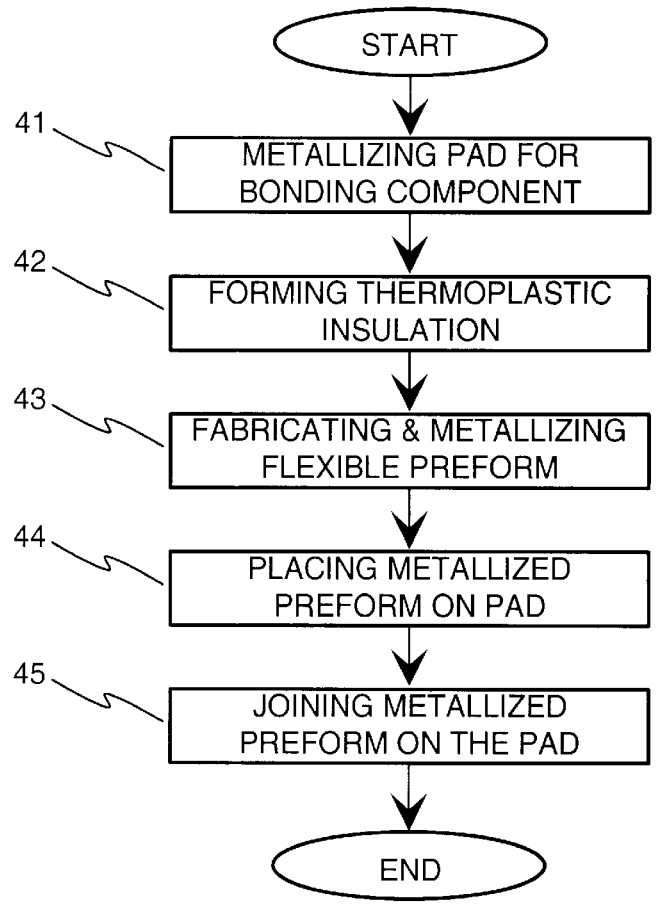
FIG. 4 is a flowchart showing the formation of an attachment bump on the attachment pad using the method according to the invention.

FIG. 4 shows a flowchart of the formation of an attachment bump on the pad using the method according to the invention. At first the pad of the component is metallized 41 for metallurgical bonding, i.e. for the transfusion process. The area between the component's pads is covered with a thermoplastic insulation 42. The thickness of the insulation surface is 45 μm with a bump pitch that is preferably about 100 μm.

A bonding surface—a layer of tin (Sn) and a layer of bismuth (Bi) is metallized 43 on to the previously known preform fabricated from a flexible material. The diameter of the preform is preferably 50 μm when a bump pitch of 100 μm is used.

The metallized preform, i.e. the bump, is placed on the pad 44 and joined 45 to it by heating the component to the temperature of formation of a joint and by pressing the preform down on to the pad with a press-down tool which is cooled from its other side. Cooling of the press-down tool prevents the formation of a joint with the tool which is used to press down on the preform, and the metal surface of the preform remains active for bonding. The thermoconductivity of the bump is so small that the temperature on the component side is simultaneously at the temperature of formation of a joint when the temperature on the side of the press-down tool is markedly lower. This also prevents flowing of the thermoplastic insulation layer on the side of the press down tool.

Figure 5:
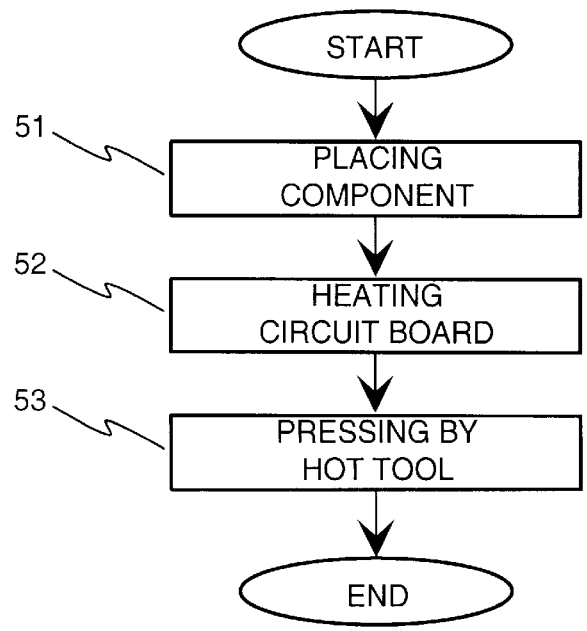
FIG. 5 is a flowchart showing the attachment of a completed component using the method according to the invention.

FIG. 5 shows a flowchart of the joining of a completed component using the method according to the invention. At first a completed component is placed on the circuit card 51. The circuit card is heated to the temperature of joint formation 52. This time a tool that preferably can be heated is used to press the component down on to the circuit card 53. Thanks to the heating of the circuit card and the component, a transfusion forming a metallurgical joint takes place between the metal surface of the bump and the metal surface of the circuit card's lead. At the same time the insulation material softens and flows between the component and the circuit card, filling the free space. The hot insulation material is preferably tacky on both sides and upon cooling hardens fast to the surface.

Figure 1:
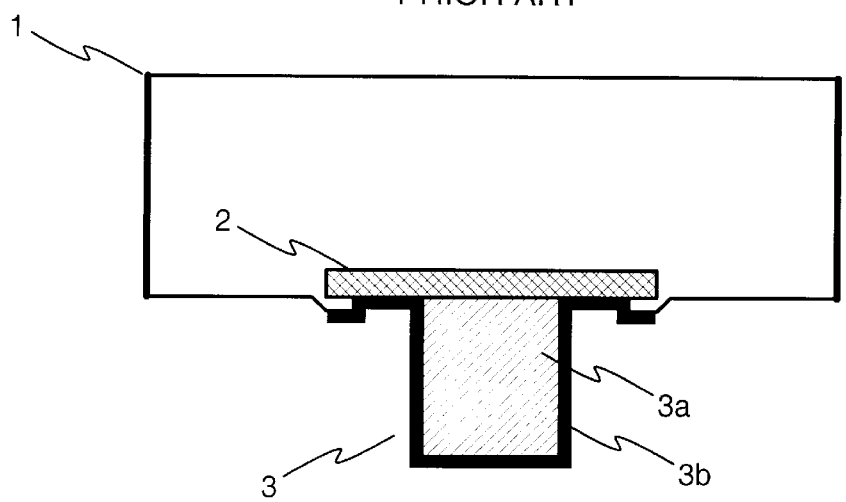
FIG. 1 shows a bump, in accordance with the prior art, with its surrounding area in a cross-sectional view before attachment of the component to the circuit card.
Figure 2:
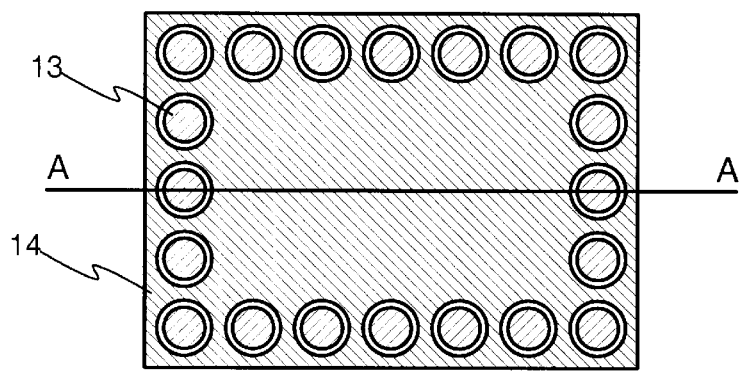
FIG. 2 shows a component to be attached in the manner according to the invention as seen from the bonding side.
Figure 3:
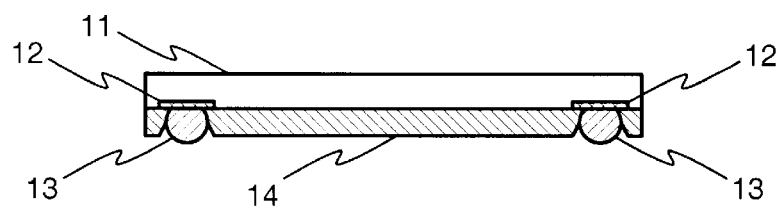
FIG. 3 shows a component to be attached in the manner according to the invention as seen in a cross-sectional view in the plane A—A.
Figure 6:
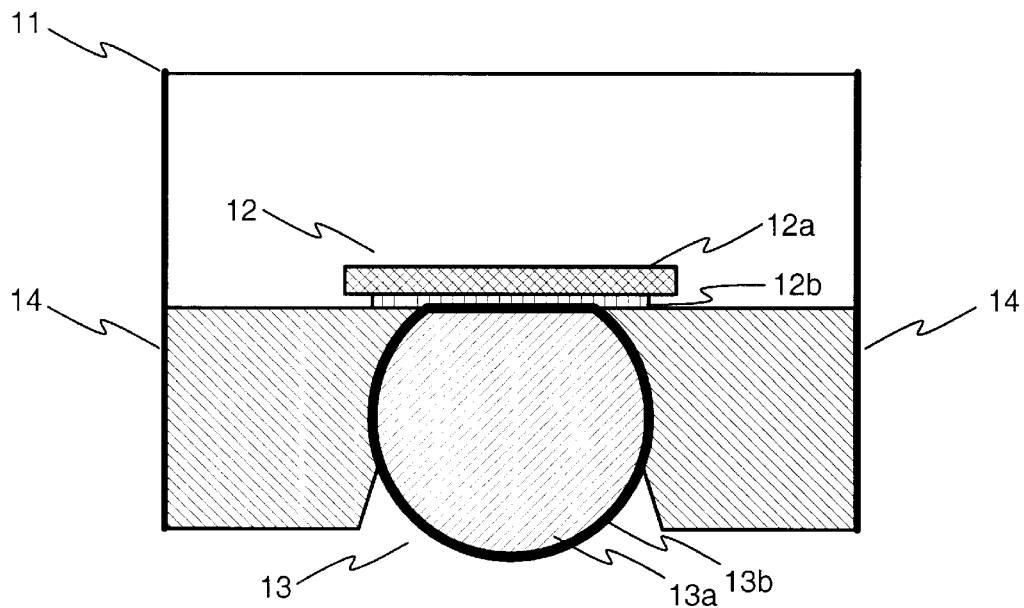
FIG. 6 shows a bump, according to the invention, with its surrounding area viewed as a cross-section in the plane A—A before attachment of the component to the circuit card.

FIG. 6 shows a bump 13 according to the invention with its surrounding area in an enlarged detailed cross-section in plane A—A of FIG. 2 before joining the component 11 to the circuit card. The component 11 is shown in the figure such that the component's pad 12a, which has a metal layer 12b, is below the component 11. The preform 13a that is made from a flexible material, which has a metal layer 13b, is affixed to the component from below the affixed surface and can be observed in the figure from the fact that the bump 13 has been flattened at its edge at the mating point so as to hug the metallized attachment pad 12. The layer of insulating material 14, which is preferably thermoplastic, is shown adjacent to the bump 13 on both sides. The insulating material 14 has heated up upon bonding of the bump 13 from the side of the component 11 in such a way that it has partly spread on top of the attachment pad 12, thus protecting the environment of the bump 13.

Figure 7:
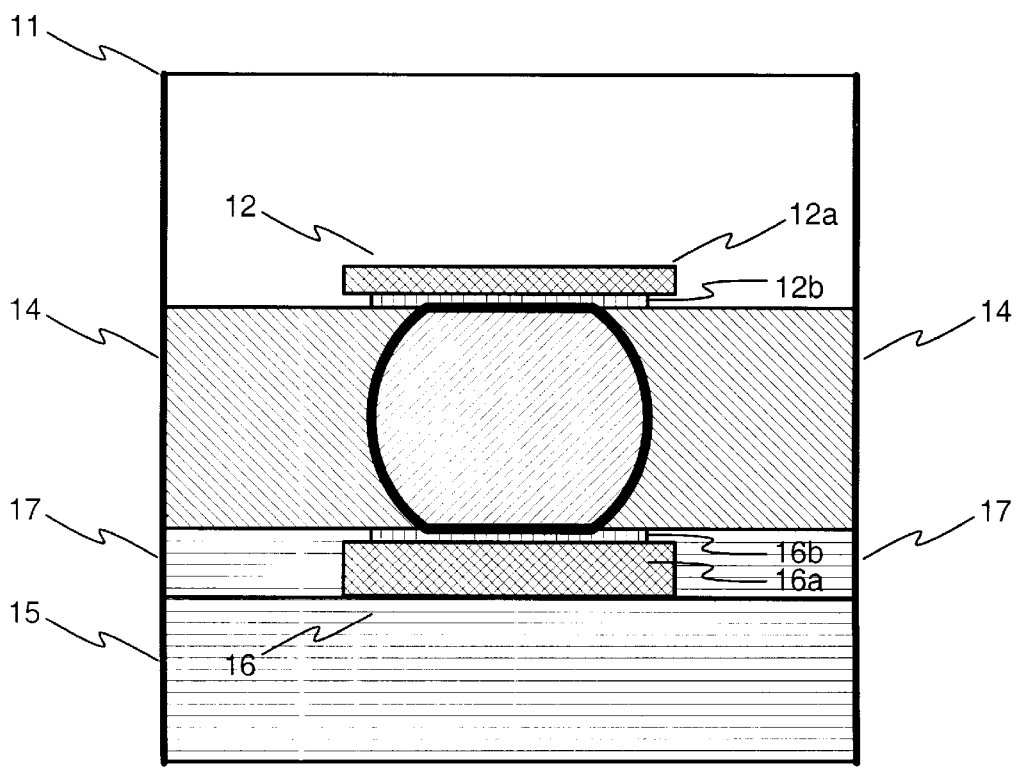
FIG. 7 shows a bump, according to the invention, with its surrounding area viewed as a cross-section in the plane A—A after attachment of the component to the circuit card.

FIG. 7 shows a bump according to the invention with its surrounding area in an enlarged detailed cross-section in the plane A—A of FIG. 2 after bonding of the component 11 to the circuit card 15. The component 11 is in the upper part of the figure and the circuit card 15 is in its lower part. Shown on top of circuit card 15 is a lead 16a and on top of it a metal layer 16b to accomplish transfusion. The areas 17 at the sides of the figure are insulation material. A metallized bump 13 is bonded to metallized pads 12, 16 by transfusion at the points that hug the surfaces when flattened out. The insulating material 14 has heated up upon bonding with the component 11 also on the side of the circuit card 15 in such a way that it has spread in part on top of the metallized lead 16, thus also protecting the surroundings of the bump 13 from the side of the circuit card 15. At the same time the insulating material 14, when hot, has stuck to the part of the pad 16 that has remained free and to the insulation layer 17.

We now examine in detail by way of example the formation of the bonding arrangement of the microcircuit 11, the testing of microcircuit 11 and its bonding to the circuit card 15 by the method according to the invention as well as the debonding. To accomplish transfusion, a metal layer 12b is formed on the pads 12a of the microcircuit 11, which pads are made, for example, of aluminium (Al). The metallization 12b of the pad 12a is formed successively of different layers of material, preferably of layers of nickel, tin and bismuth (Ni, Sn and Bi).

The area remaining free from the attachment pads 12 of the component 11 is coated with an insulating material 14 by masking in such a way that the insulating material 14, which preferably is thermoplastic or resin, does not get on to the pads 12. The insulating material 14 is solid at its normal temperature but becomes fluid and tacky at the transfusion bonding temperature.

Employing the prior art, preforms 13a are made of a flexible material and a metal layer 13b is formed on them. The metal layer 13b of an individual layer is formed preferably by placing the preforms 13a in an electrolyte from which the metal layer 13b grows evenly on the surface of the preforms 13a. The entire metal layer 13 is formed of successive layers, preferably layers of chrome, nickel or copper (Cr, Ni or Cu) as well as of a layer of tin and bismuth (Sn and Bi).

The metallized preforms, i.e. bumps, 13 are placed on the metallized pads 12 which have remained free of the insulating material 14 and the preforms are bonded by transfusion by heating the component 11 and cooling the press-down tool which is used to press the bumps 13 on to the pads 12 of the microcircuit. The bumps 13 are thus bonded metallurgically by transfusion to the pads 12 of the component 11, the pads being at the bonding temperature. The bumps 13 do not bond with the surface of the tool that is used to press them down on to the pads 12 because the tool is cooled to a temperature that is under that required to form a joint. The insulation material 14 fuses on the side of component 11 owing to the heat and it protects the pad 12 around the bump. On the tool's side, the insulating material 14 nevertheless remains solid due to the cooling and thus does not change in form.

The silicon wafer consisting of several integrated microcircuits 11 is diced into discrete integrated circuits 11 preferably in this stage.

Microcircuit 11 is tested by making an electrical connection to the metallization 13b of the pads 13 by pressing the bumps with the lead surfaces of the test bed. Bismuth (Bi) is a semiprecious metal whose metallization 13b is very conductive and does not oxidize. The flexible preform 13a makes possible the use of an even test bed because the small differences in height are offset by the flexibility of the bump 13. The even lead surfaces do not leave probe marks on the metal surface 13b of the bumps.

After this the component 11–14 that has passed the testing and is ready for installation is bonded to the circuit card 15–17 by heating both to the transfusion formation temperature and pressing the component 11 down on to the circuit card 15. This is how a metallurgical bond is formed between the bump 13 and the metal-surfaced lead 16. This transfusion does not have an effect on the previously formed bond of the bump 13 with the pad 12 because the temperature at which the bond melts is higher than the bonding temperature and the temperature is not raised up to the melting temperature. The insulating material 14 fuses and becomes tacky, whereby it flows snugly around the bump 13. Thus a subsequent work phase is not required to fill the empty space of the bonding side of the component 11 with insulating material.

Component 11 can be debonded by heating the bond to the melting point.

The invention is not restricted merely to the above presented embodiments, but many variations are possible within the purview of the invention's concept as defined in the claims.

I claim:

1. A method of fabricating an attachment bump of a component in which method a flexible preform is fabricated and plated with metal, characterized in that the metal used for plating is appropriate for metallurgical bonding.

2. A method of attaching a component to the surface of a circuit card using bumps, characterized in that the bumps are formed from preforms that are made from a flexible material, which preforms are metallized with a metal layer over their entire surface.

3. A method according to claim 2, characterized in that the bump that has been formed is attached to a pad of the component and a pad of the circuit card with metal layers between the pads and the bump.

4. A method according to claim 3, characterized in that the bond is formed by metallurgical transfusion.

5. A method according to claim 2, characterized in that surface of bonding side of the component is coated with an insulating material before the component is attached to the circuit card in an area outside the attachment pads.

6. A method according to claim 5, characterized in that the mentioned insulating material is thermoplastic, thermoplastic resin or thermosetting plastic in B state.

7. A method according to claim 1 with an attachment bump of a component characterized in that it comprises a flexible preform and a layer of material appropriate for metallurgical bonding on external surface of the preform characterized in that bismuth (Bi) is used as part of the material for the metallurgical bonding of the mentioned bonding material.

8. A method according to claim 1 wherein an attachment bump of a component is characterized in that it comprises a flexible preform and a layer of material appropriate for metallurgical bonding on external surface of the preform characterized in that the mentioned preform is spherical.

9. A method according to claim 1, wherein an attachment bump is characterized in that the metal surface of the bump and/or the metal surface of the attachment pad comprise several metal layers.

10. A method according to claim 9, an attachment bump, or arrangement, characterized in that there are three of the mentioned metal layers and their sequence from inner to outer layer is at least one of chrome, nickel or copper (Cr, Ni or Cu) as well as a first layer of tin (Sn) and bismuth (Bi).

11. A method according to claim 1 with an attachment bump of a component including a procedure for attaching a component to a circuit card characterized in that it comprises a first attachment pad on the component, a second attachment pad on the circuit card, metallizations on the mentioned attachment pads, a flexible preform between the component and the circuit card, and a metal layer on outer surface of the preform for accomplishing electrical bonding of the metallizations of the attachment pads of the component and the circuit card to each other, characterized in that bismuth (Bi) is used as part of the material for the metallurgical bonding of the mentioned bonding material.

12. A method according to claim 1 wherein an attachment bump of a component is characterized by a flexible preform, a layer of material appropriate for metallurgical bonding on external surface of the preform and including wherein the procedure for attaching a component to a circuit card characterized in that it comprises a first attachment pad on the component, a second attachment pad on the circuit card, metallizations on the mentioned attachment pads, a flexible preform between the component and the circuit card, and a metal layer on outer surface of the preform for accomplishing electrical bonding of the metallizations of the attachment pads of the component and the circuit card to each other, further characterized in that the mentioned preform is spherical.

* * * * *